(12) United States Patent
Yao et al.

(10) Patent No.: US 8,119,499 B2
(45) Date of Patent: Feb. 21, 2012

(54) SEMICONDUCTOR SUBSTRATE FABRICATION BY ETCHING OF A PEELING LAYER

(75) Inventors: Takafumi Yao, Miyagi-ken (JP); Meoung-Whan Cho, Miyagi-ken (JP)

(73) Assignees: Tohoku Techno Arch Co., Ltd., Sendai-shi, Miyagi-ken (JP); Furukawa Co., Ltd., Tokyo (JP); Mitsubishi Chemical Corporation, Tokyo (JP); Dowa Holdings Co., Ltd., Tokyo (JP); Epivalley Co., Ltd., Gumi, Gyungsangbuk-do (KR); Wavesquare Inc., Yongin, Gyeonggi-do (KR)

( * ) Notice: Subject to any disclaimer, the term of this patent is extended or adjusted under 35 U.S.C. 154(b) by 340 days.

(21) Appl. No.: 12/064,584

(22) PCT Filed: Aug. 24, 2006

(86) PCT No.: PCT/JP2006/316635
§ 371 (c)(1),
(2), (4) Date: Jul. 24, 2008

(87) PCT Pub. No.: WO2007/023911
PCT Pub. Date: Mar. 1, 2007

(65) Prior Publication Data
US 2008/0299746 A1 Dec. 4, 2008

(30) Foreign Application Priority Data

Aug. 25, 2005 (JP) ................. 2005-244021

(51) Int. Cl.
*H01L 21/20* (2006.01)
*H01L 21/46* (2006.01)
*H01L 21/36* (2006.01)

(52) U.S. Cl. ... 438/458; 438/488; 438/507; 257/E21.57; 257/E21.6

(58) Field of Classification Search .................. 438/458, 438/488, 507; 257/E21.57, E21.6
See application file for complete search history.

(56) References Cited

U.S. PATENT DOCUMENTS

| 5,290,393 A | 3/1994 | Nakamura |
| 5,770,887 A | 6/1998 | Tadatomo et al. |
| 5,810,925 A * | 9/1998 | Tadatomo et al. ............ 117/90 |

(Continued)

FOREIGN PATENT DOCUMENTS
EP  0 497 350  8/1992

(Continued)

OTHER PUBLICATIONS

W.H. Lee, J.J. Kim, H. S. Lee, S.T. Kim; S. Agus, V. Zhara, M. W. Cho, and T. Yao Low Temperature CrxN buffer layer for GaN growth using MBE, Extended Abstracts (The 51st Spring Meeting, 2004); The Japan Society of Applied Physics and Related Societies.

(Continued)

*Primary Examiner* — Kevin Parendo
(74) *Attorney, Agent, or Firm* — Cowan, Liebowitz & Latman, P.C.

(57) ABSTRACT

A semiconductor substrate fabrication method according to the first aspect of this invention is characterized by including a preparation step of preparing an underlying substrate, a stacking step of stacking, on the underlying substrate, at least two multilayered films each including a peeling layer and a semiconductor layer, and a separation step of separating the semiconductor layer.

10 Claims, 15 Drawing Sheets

U.S. PATENT DOCUMENTS

| | | | |
|---|---|---|---|
| 6,218,207 B1 | 4/2001 | Itoh et al. | |
| 7,033,961 B1* | 4/2006 | Smart et al. | 438/796 |
| 2002/0155712 A1* | 10/2002 | Urashima et al. | 438/689 |
| 2002/0197825 A1* | 12/2002 | Usui et al. | 438/459 |
| 2004/0200406 A1* | 10/2004 | Peczalski et al. | 117/95 |
| 2005/0040425 A1* | 2/2005 | Akita | 257/103 |
| 2006/0121694 A1* | 6/2006 | Tamura | 438/458 |

FOREIGN PATENT DOCUMENTS

| | | |
|---|---|---|
| JP | 04-297023 A | 10/1992 |
| JP | 07-165498 A | 6/1995 |
| JP | 2000-049092 | 2/2000 |
| JP | 2002-316898 | 10/2002 |
| JP | 2004-039810 | 2/2004 |
| JP | 2005-001928 | 1/2005 |

OTHER PUBLICATIONS

Kyokugen Ri et al., "MBE-ho ni yoru Teion CRxN Buffer-so o Mochiita GaN no Seicho", Dai 51 Kai Oyo Butsurigaku Kankei Rengo Koenkai Koen Yokoshu Mar. 28, 2004, No. 1, p. 364, middle part, 28p-YK-5.

PCT/IB/338 and PCT/IPEA/409 which comprise an English translation of Form PCT/IPEA/409 (International Preliminary Report on Patentability for PCT/JP2006/316635) submitted to the USPTO on Feb. 22, 2008.

Dec. 1, 2008 Japanese Office Action that issued in Japanese Patent Application No. 2007-532177.

"Gallium Nitride Template Substrate: Cost Reduction by Chemical Etching" Nikkan Kogyo Shinbun, Apr. 7, 2005, p. 24.

* cited by examiner

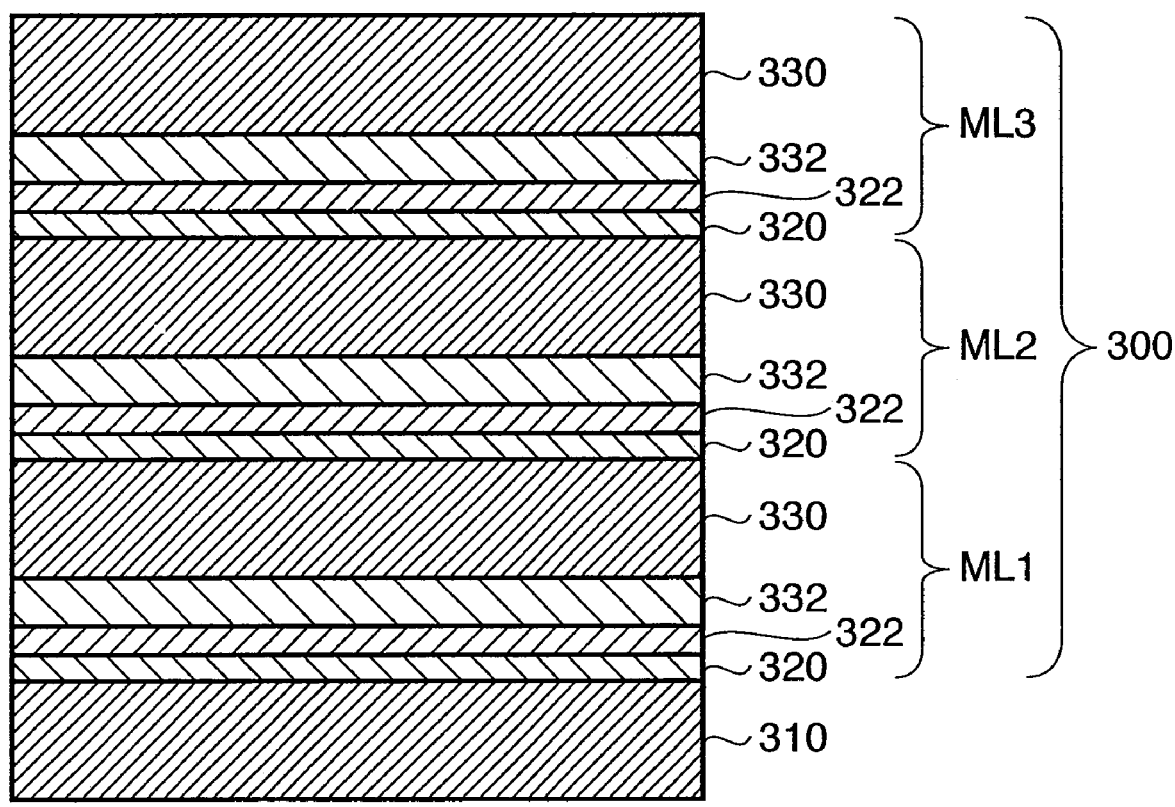
F I G. 13

F I G. 14
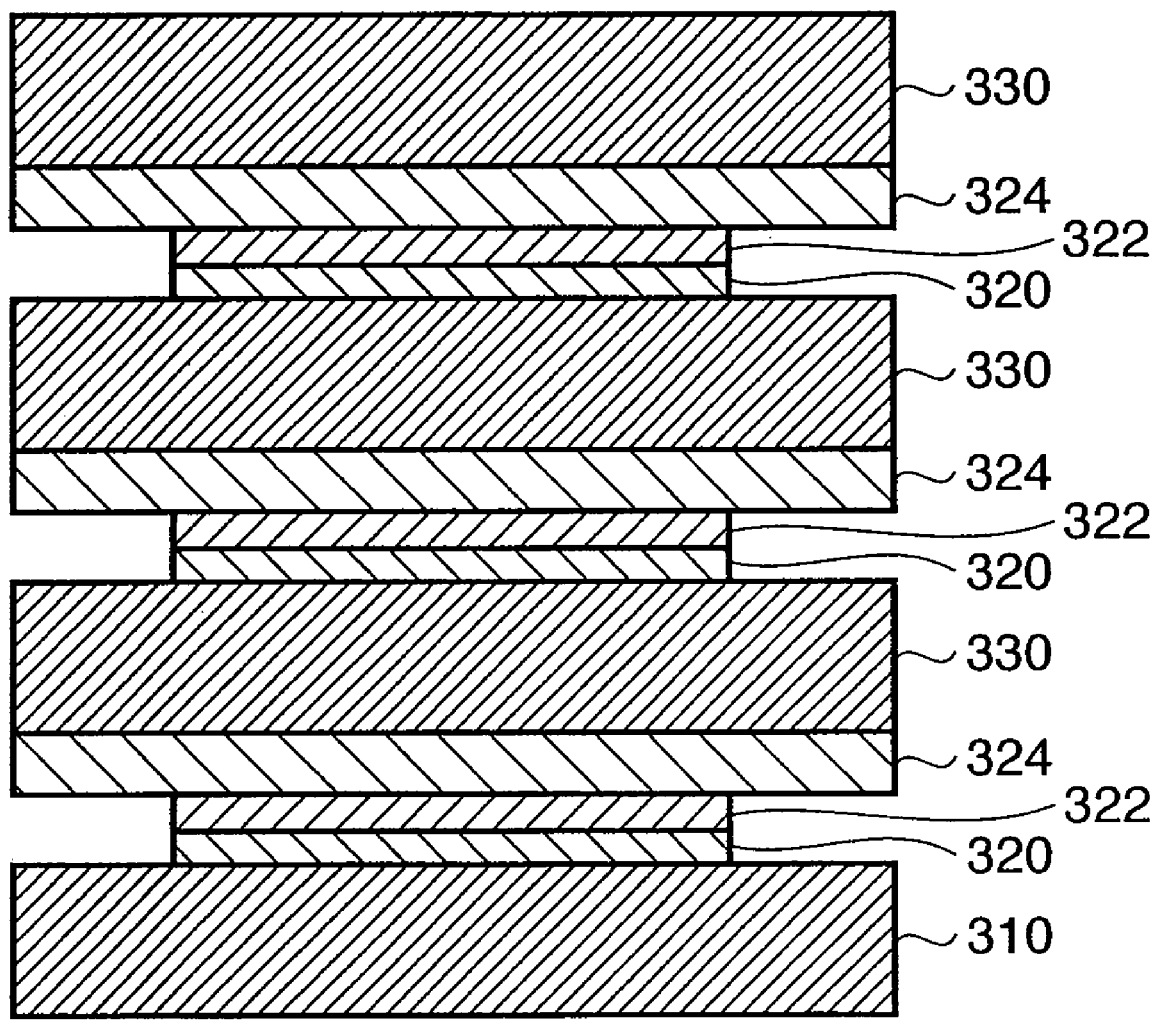

SEMICONDUCTOR SUBSTRATE FABRICATION BY ETCHING OF A PEELING LAYER

CROSS-REFERENCE TO RELATED APPLICATIONS

This application is a national stage application of International Application No. PCT/JP2006/316635, filed Aug. 24, 2006, whose benefit is claimed and which claims the benefit of Japanese Patent Application No. 2005-244021, filed Aug. 25, 2005, whose benefit is also claimed.

TECHNICAL FIELD

The present invention relates to a semiconductor substrate fabrication method.

BACKGROUND ART

A method of fabricating a GaN substrate using a sapphire underlying substrate has been conventionally proposed. The conventional GaN substrate fabrication method will be explained below with reference to FIGS. 1 to 3. FIGS. 1 to 3 are sectional views showing the steps in the GaN substrate fabrication method.

In a step shown in FIG. 1, a sapphire underlying substrate 110 is prepared as an underlying substrate. A peeling layer (low-temperature GaN buffer layer) 120 is grown on the sapphire underlying substrate 110 at a temperature (low temperature) lower than 1,000° C. The peeling layer 120 can be made of, e.g., a single-crystal material, polycrystalline material, or amorphous material of GaN. Then, a GaN layer 130 is grown at a temperature (high temperature) of about 1,000° C. The GaN layer 130 can be made of, e.g., a single-crystal material of GaN. In this manner, a structure 100 including the peeling layer 120 and GaN layer 130 is formed on the sapphire underlying substrate 110. Note that the peeling layer 120 also has a buffering function.

In a step shown in FIG. 2, the sapphire underlying substrate 110 and structure 100 (in a reaction chamber) are cooled from about 1,000° C. to room temperature. The thermal expansion coefficient of the sapphire underlying substrate 110 is higher than that of the GaN layer 130. When the temperature is lowered from about 1,000° C. to room temperature, therefore, a thermal stress resulting from the thermal expansion coefficient difference acts on the sapphire underlying substrate 110 and GaN layer 130, and warping occurs.

In a step shown in FIG. 3, the peeling layer 120 is melted by the laser lift-off method or the like. This separates the GaN layer 130 from the sapphire underlying substrate 110. That is, a GaN substrate is fabricated by separating the GaN layer 130 from the sapphire underlying substrate 110. In this state, the GaN layer 130 produces a portion in which the internal stress has reduced, and a portion in which the internal stress remains. This may crack the GaN layer 130.

The separated GaN layer 130 warps because the distribution of strain changes along the crystal growth direction. Accordingly, even when the GaN layer is planarized by a mechanical polishing step, the crystal orientation is distorted as shown in FIG. 3.

To reduce this warping, a method of forming a gap between the sapphire underlying substrate 110 and peeling layer 120 has been proposed (e.g., patent reference 1).

Patent Reference 1: Japanese Patent Laid-Open No. 2004-39810

DISCLOSURE OF INVENTION

In the technique disclosed in patent reference 1, only one semiconductor substrate can be fabricated from the underlying substrate. This decreases the throughput (productivity) in the fabrication of semiconductor substrates.

The present invention provides a semiconductor substrate fabrication method capable of increasing the throughput.

A semiconductor substrate fabrication method according to the first aspect of the present invention is characterized by comprising a preparation step of preparing an underlying substrate, a stacking step of stacking, on the underlying substrate, at least two multilayered films each including a peeling layer and a semiconductor layer, and a separation step of separating the semiconductor layer.

A semiconductor substrate fabrication method according to the second aspect of the present invention is characterized in that in the separation step, at least two semiconductor layers are separated by selectively etching the peeling layers by using a chemical solution, in addition to having the characteristic of the semiconductor substrate fabrication method according to the first aspect of the present invention.

A semiconductor substrate fabrication method according to the third aspect of the present invention is characterized in that in the stacking step, stacking is continuously performed without atmospheric exposure, in addition to having the characteristic of the semiconductor substrate fabrication method according to the first or second aspect of the present invention.

A semiconductor substrate fabrication method according to the fourth aspect of the present invention is characterized in that in the stacking step, stacking is performed in the same apparatus, in addition to having the characteristic of the semiconductor substrate fabrication method according to the first or second aspect of the present invention.

A semiconductor substrate fabrication method according to the fifth aspect of the present invention is characterized in that the underlying substrate and the semiconductor layer are made of a single crystal of a compound semiconductor, in addition to having the characteristic of the semiconductor substrate fabrication method according to any one of the first to fourth aspects of the present invention.

A semiconductor substrate fabrication method according to the sixth aspect of the present invention is characterized in that the underlying substrate and the semiconductor layer are made of a compound of a group-III element and nitrogen, in addition to having the characteristic of the semiconductor substrate fabrication method according to any one of the first to fifth aspects of the present invention.

A semiconductor substrate fabrication method according to the seventh aspect of the present invention is characterized in that the underlying substrate and the semiconductor layer are made of the same material, in addition to having the characteristic of the semiconductor substrate fabrication method according to any one of the first to sixth aspects of the present invention.

A semiconductor substrate fabrication method according to the eighth aspect of the present invention is characterized in that the peeling layer comprises at least one of a metal layer and a metal nitride layer, in addition to having the characteristic of the semiconductor substrate fabrication method according to any one of the first to seventh aspects of the present invention.

A semiconductor substrate fabrication method according to the ninth aspect of the present invention is characterized in that in the stacking step, the metal nitride layer is formed by nitriding the metal layer in a reaction furnace which grows the semiconductor layer, in addition to having the characteristic of the semiconductor substrate fabrication method according to the eighth aspect of the present invention.

A semiconductor substrate fabrication method according to the 10th aspect of the present invention is characterized in that the multilayered film includes a buffer layer between the peeling layer and the semiconductor layer, in addition to having the characteristic of the semiconductor substrate fabrication method according to any one of the first to ninth aspects of the present invention.

A semiconductor substrate fabrication method according to the 11th aspect of the present invention is characterized in that the buffer layer is made of a single crystal of a compound semiconductor, in addition to having the characteristic of the semiconductor substrate fabrication method according to the 10th aspect of the present invention.

A semiconductor substrate fabrication method according to the 12th aspect of the present invention is characterized in that the buffer layer is made of a compound of a group-III element and nitrogen, in addition to having the characteristic of the semiconductor substrate fabrication method according to the 10th or 11th aspect of the present invention.

A semiconductor substrate fabrication method according to the 13th aspect of the present invention is characterized in that the buffer layer and the semiconductor layer are made of the same material, in addition to having the characteristic of the semiconductor substrate fabrication method according to any one of the 10th to 12th aspects of the present invention.

The present invention can increase the throughput.

BRIEF DESCRIPTION OF DRAWINGS

FIG. 13 is a sectional view showing still another step in the semiconductor substrate fabrication method according to the embodiment of the present invention;

FIG. 14 is a sectional view showing still another step in the semiconductor substrate fabrication method according to the embodiment of the present invention.

BEST MODE FOR CARRYING OUT THE INVENTION

Figure 1:
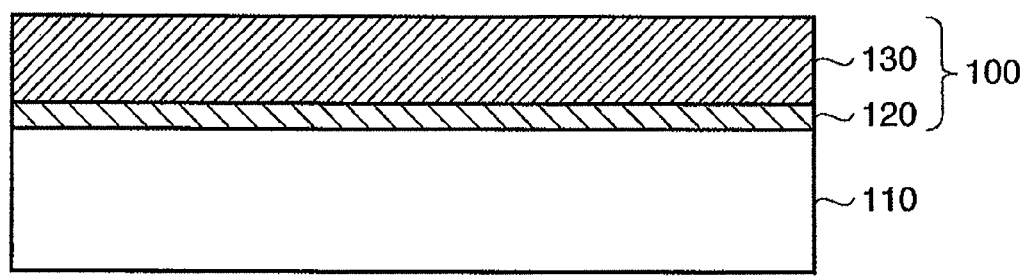
FIG. 1 is a sectional view showing a step in a conventional GaN substrate fabrication method.
Figure 2:
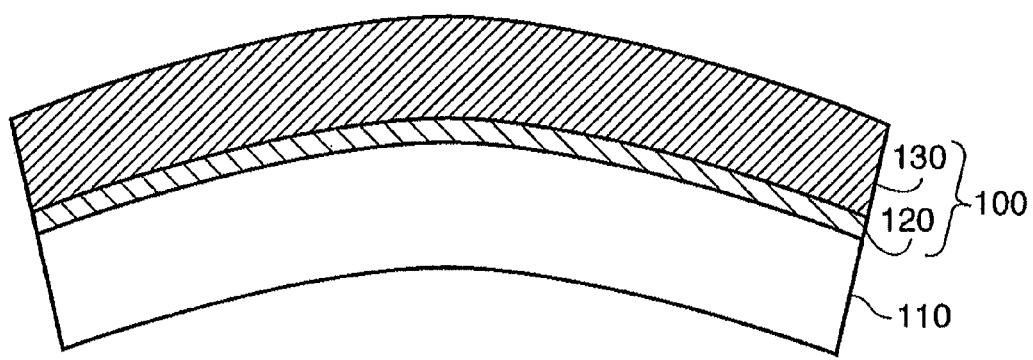
FIG. 2 is a sectional view showing another step in the conventional GaN substrate fabrication method.
Figure 3:
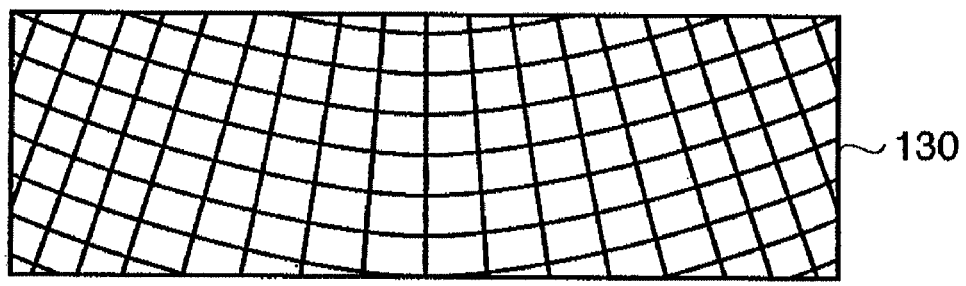
FIG. 3 is a sectional view showing still another step in the conventional GaN substrate fabrication method.
Figure 4:
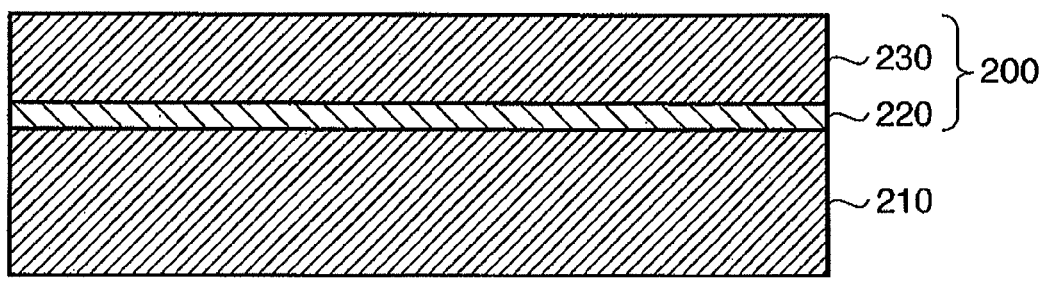
FIG. 4 is a sectional view of a step showing a problem to be solved by the present invention.
Figure 5:
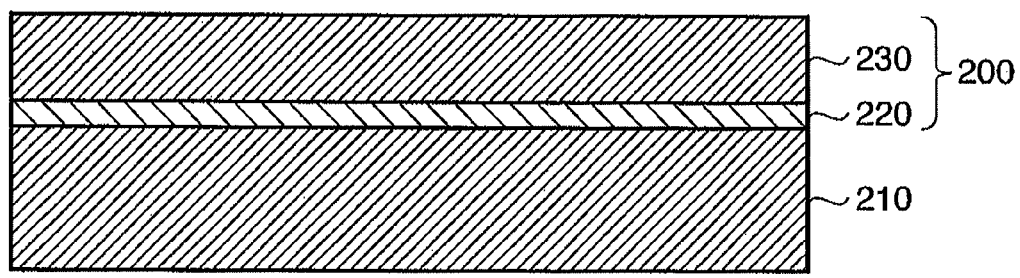
FIG. 5 is a sectional view of another step showing the problem to be solved by the present invention.
Figure 6:
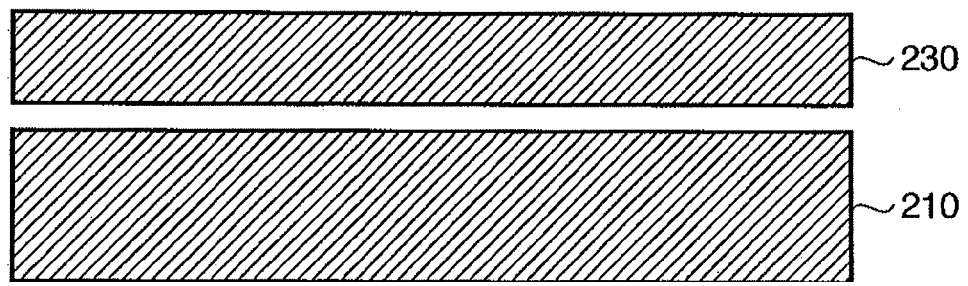
FIG. 6 is a sectional view of still another step showing the problem to be solved by the present invention.

Problems to be solved by the present invention will be explained in detail below with reference to FIGS. 4 to 6. FIGS. 4 to 6 are sectional views of steps showing the problems to be solved by the present invention. Although the following explanation will be made by taking a method of fabricating a GaN substrate (semiconductor substrate) by using a GaN underlying substrate (underlying substrate) as an example, the present invention is also applicable to a method of fabricating another semiconductor substrate by using another underlying substrate. The other underlying substrate can be made of a nitride such as InN, AlN, InGaN, AlGaN, InAlN, or AlInGaN, a group-IV material such as SiC or Si, an oxide such as $Al_2O_3$, $MgAl_2O_4$, $LiGa_2O_4$, or ZnO, or a nitridable metal such as Fe, Cr, Mo, Ta, Nb, Ti, or Cu. The other semiconductor substrate can be made of a nitride such as AlN, InN, or AlGaInN, or an oxide such as ZnO, ZnMgO, ZnCdO, or ZnMgCdO.

In a step shown in FIG. 4, a GaN underlying substrate 210 is prepared as an underlying substrate. A peeling layer (metal buffer layer) 220 is formed on the GaN underlying substrate 210. The peeling layer 220 can be made of a nitridable metal such as Fe, Cr, Mo, Ta, Nb, Ti, or Cu.

A GaN layer (semiconductor layer) 230 is grown on the peeling layer 220 at about 1,000° C. The GaN layer 230 can be made of, e.g., a single-crystal material of GaN. In this manner, a structure 200 including the peeling layer 220 and GaN layer 230 is formed on the GaN underlying substrate 210. Note that the peeling layer 220 also has a buffering function.

In a step shown in FIG. 5, the GaN underlying substrate 210 and structure 200 (in a reaction chamber) are cooled from about 1,000° C. to room temperature. The thermal expansion coefficient of the GaN underlying substrate 210 is almost equal to that of the GaN layer 230. When the temperature is lowered from about 1,000° C. to room temperature, therefore, almost no thermal stress resulting from the thermal expansion coefficient difference acts on the GaN underlying substrate 210 and GaN layer 230, and almost no warping occurs.

In a step shown in FIG. 6, the peeling layer 220 is selectively etched by using a chemical solution. This separates the GaN layer 230 from the GaN underlying substrate 210. That is, a GaN substrate is fabricated by separating the GaN layer 230 from the GaN underlying substrate 210. In this state, the internal stress is almost uniform in the GaN layer 230. This reduces the possibility of cracking of the GaN layer 230.

As described above, the GaN substrate fabrication method shown in FIGS. 4 to 6 generally fabricates only one GaN substrate from the GaN underlying substrate 210. Accordingly, the throughput of the fabrication of GaN substrates is often insufficient.

A semiconductor substrate fabrication method according to an embodiment of the present invention will be explained below with reference to FIGS. 7 to 15. FIGS. 7 to 11 and 13 to 15 are sectional views showing the steps in the semiconductor substrate fabrication method according to the embodiment of the present invention. FIG. 12 is a sectional SEM photograph of a sample obtained by the steps shown in FIGS. 7 to 11. Although the following explanation will be made by taking a method of fabricating a GaN substrate (semiconductor substrate) by using a GaN underlying substrate (underlying substrate) as an example, the present invention is also applicable to a method of fabricating another semiconductor substrate by using another underlying substrate. The other underlying substrate can be made of a nitride such as InN, AlN, InGaN, AlGaN, InAlN, or AlInGaN, a group-IV material such as SiC or Si, an oxide such as $Al_2O_3$, $MgAl_2O_4$, $LiGa_2O_4$, or ZnO, or a nitridable metal such as Fe, Cr, Mo, Ta, Nb, Ti, or Cu. The other semiconductor substrate can be made of a nitride such as ALN, InN, or AlGaInN, or an oxide such as ZnO, ZnMgO, ZnCdO, or ZnMgCdO.

In addition, a method using HVPE (Hydride Vapor Phase Epitaxy) will be explained as an example, but the present invention can also be applied to a method using, e.g., MOCVD (Metal-Organic Chemical Vapor Deposition), MOVPE (Metal-Organic Vapor Phase Epitaxy), MBE (Molecular Beam Epitaxy), or the dissolution growth method.

Figure 7:
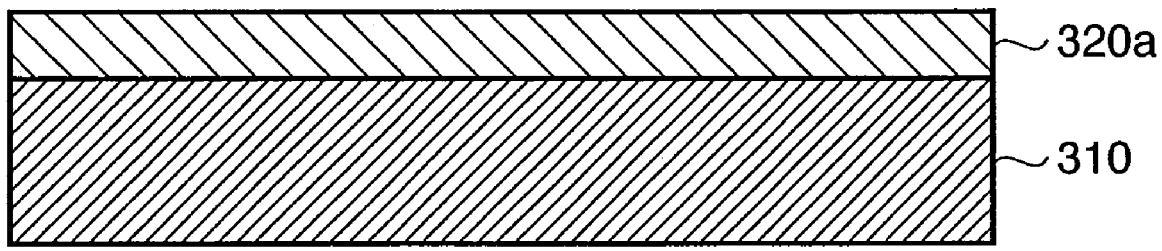
FIG. 7 is a sectional view showing a step in a semiconductor substrate fabrication method according to an embodiment of the present invention.

In a step shown in FIG. 7, a GaN underlying substrate 310 is prepared as an underlying substrate. The thickness of the GaN underlying substrate 310 is preferably 100 to 500 μm.

Note that a term "multilayered film" means a film including two or more layers in this specification.

A peeling layer (metal buffer layer) 320a is deposited on the GaN underlying substrate 310 by sputtering. The peeling layer 320a is a nitridable metal layer. The peeling layer 320a can be made of a nitridable metal such as Fe, Cr, Mo, Ta, Nb, Ti, or Cu. The thickness of the peeling layer 320a is preferably 15 to 75 nm.

Note that the peeling layer 320a may also be formed by an e-beam evaporator, a thermal evaporator, or the crystal growth method such as CVD, MOCVD, or MBE.

Figure 8:
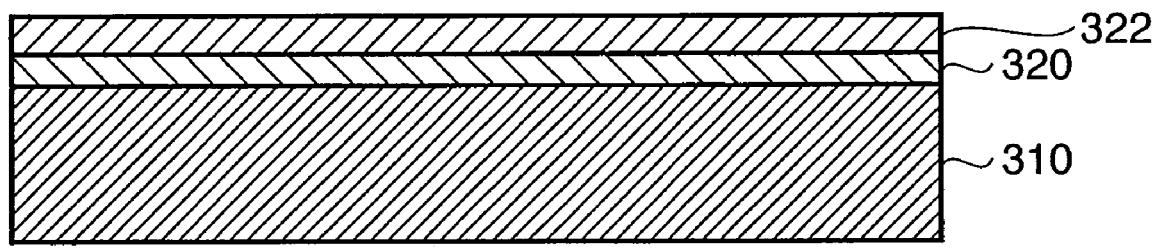
FIG. 8 is a sectional view showing another step in the semiconductor substrate fabrication method according to the embodiment of the present invention.

In a step shown in FIG. 8, a portion (upper layer) of the peeling layer 320a is nitrided in an ambience of hydrogen gas containing ammonia at a substrate temperature of 500° C. to 1,000° C. Even if a native oxide film exists on the surface of the peeling layer 320a, a strong reducing action of ammonia reduces and nitrides this native oxide film. As a consequence, the peeling layer 320a divides into a first peeling layer 320 and second peeling layer 322. The first peeling layer (metal buffer layer) 320 is an unnitrided layer of the peeling layer 320a, and can be made of a nitridable metal such as Fe, Cr, Mo, Ta, Nb, Ti, or Cu. The second peeling layer (metal nitride layer) 322 is a nitrided layer of the peeling layer 320a, and can be made of a metal nitride such as $Fe_2N$, CrN, MoN, TaN, NbN, TiN, or CuN. The first peeling layer 320 is favorably Cr. The second peeling layer 322 is favorably CrN.

Note that the first peeling layer 320 also has a buffering function. Similarly, the second peeling layer 322 also has a buffering function. Note also that in the step shown in FIG. 8, the second peeling layer 322 may also be formed by entirely nitriding the peeling layer 320a. When the second peeling layer 322 is formed by entirely nitriding the peeling layer 320a, the thickness of the second peeling layer 322 is preferably 15 to 75 nm. Depending on the nitrogen conditions, however, the thickness of the second peeling layer 322 is sometimes smaller than that of the peeling layer 320a.

The flow rate of ammonia, the nitriding temperature, and the nitriding time mainly determine the conditions of the process of forming the uniform second peeling layer 322 on the surface of the peeling layer 320a. The process conditions for the purpose are favorably an ammonia flow rate of 1 (l/min), a nitriding temperature of 1,000° C. or more, and a nitriding time of 5 min or more.

The second peeling layer 322 functions as a nucleus for forming GaN layers (a buffer layer 332 and GaN layer 330) in a step shown in FIG. 9 to be described below. Accordingly, the steps shown in FIGS. 8 and 9 are preferably successively performed without atmospheric exposure as will be described below.

Figure 9:
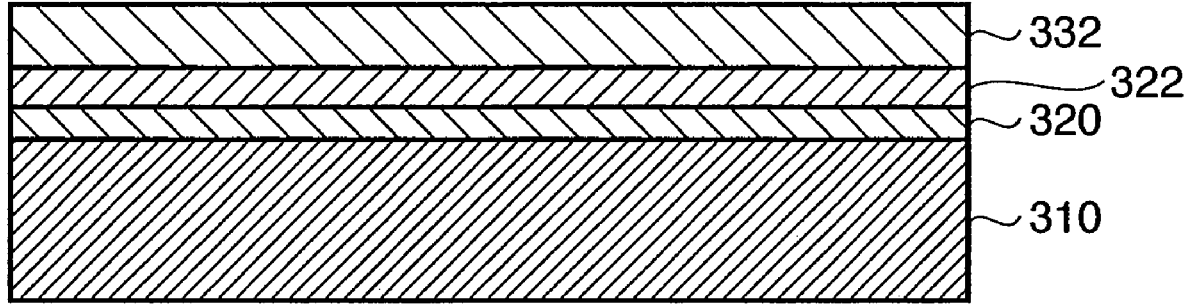
FIG. 9 is a sectional view showing still another step in the semiconductor substrate fabrication method according to the embodiment of the present invention.

In the step shown in FIG. 9, the buffer layer 332 is grown on the second peeling layer 322 at a temperature (low temperature) of about 600° C. to 1,000° C. More specifically, HCl gas is supplied to a Ga metal material box formed upstream of a reaction chamber via a reaction tube. In the Ga metal material box, the HCl gas and Ga cause a chemical reaction to form GaCl gas. This GaCl gas is supplied from the Ga metal material box to the reaction chamber via the reaction tube. In the reaction chamber, the ammonia-containing hydrogen gas used in the step shown in FIG. 8 remains near the surface of the second peeling layer 322. In the reaction chamber, therefore, the GaCl gas and ammonia gas cause a chemical reaction to form the buffer layer 332 on the second peeling layer 322. The buffer layer (GaN buffer layer) 332 can be made of, e.g., a single-crystal material, polycrystalline material, or amorphous material of GaN. The thickness of the buffer layer 332 is preferably a few ten Å to a few ten μm. The growth temperature of the buffer layer 332 is favorably 800° C. to 1,100° C., and more favorably, about 900° C.

Since the buffer layer 332 is made of the same material (GaN) as that of the GaN layer (semiconductor layer) 330 to be described later, the GaN layer (semiconductor layer) 330 can easily grow.

Note that the buffer layer 332 may also be made of a material different from that of the GaN layer (semiconductor layer) 330 to be described later. For example, the buffer layer 332 may also be made of a nitride such as AlN, $Al_xGa_yN$, $In_xGa_yN$, or $Al_xGa_yIn_zN$ (wherein $0 \leq x \leq 1$, $0 \leq y \leq 1$, and $0 \leq z \leq 1$), or an oxide such as ZnO.

Figure 10:
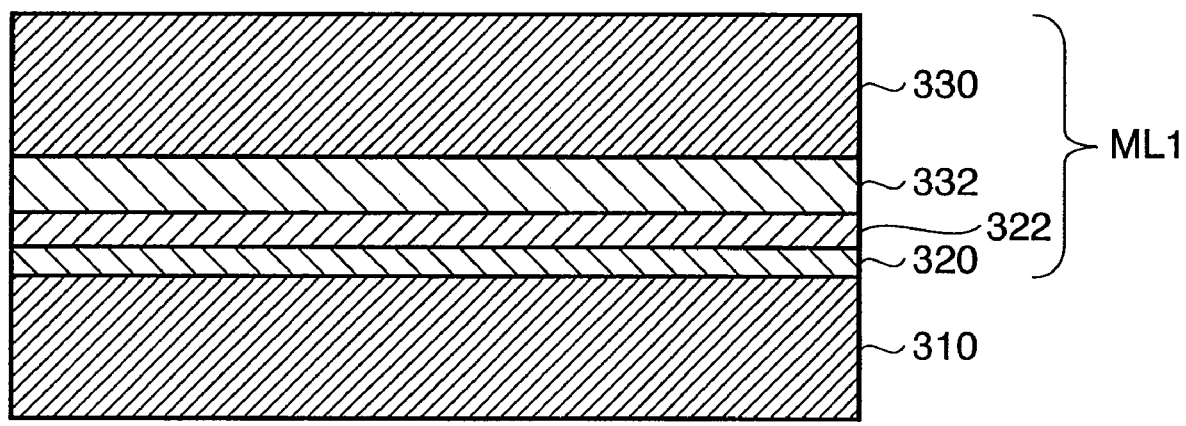
FIG. 10 is a sectional view showing still another step in the semiconductor substrate fabrication method according to the embodiment of the present invention.

In a step shown in FIG. 10, the GaN layer (semiconductor layer) 330 is grown on the buffer layer 332 at a temperature (high temperature) of 1,000° C. or more. The GaN layer (thick GaN layer) 330 can be made of, e.g., a single-crystal material of GaN. Practical conditions are basically the same as those in the step shown in FIG. 9, except that the flow rate of the HCl gas supplied to the Ga metal material box is high, and the temperature in the reaction chamber is high. Accordingly, the GaN layer 330 grows at a rate (e.g., about 100 μm/h or more) higher than that in the step shown in FIG. 9. The thickness of the GaN layer 330 is preferably 100 to 500 μm. The growth temperature of the GaN layer 330 is preferably 1,000° C. or more. As a consequence, a multilayered film ML1 including the first peeling layer 320, second peeling layer 322, buffer layer 332, and GaN layer 330 is formed on the GaN underlying substrate 310.

Note that the GaN layer 330 may also be controlled to have a conductivity type such as an n-type or p-type by doping a slight amount of an impurity such as Si or Mg during or after the growth.

Figure 11:
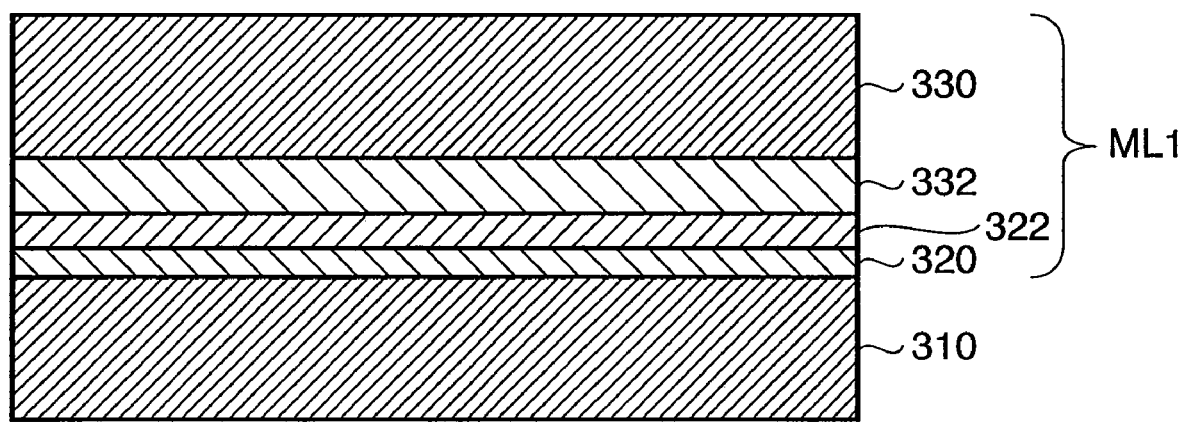
FIG. 11 is a sectional view showing still another step in the semiconductor substrate fabrication method according to the embodiment of the present invention.
Figure 12:
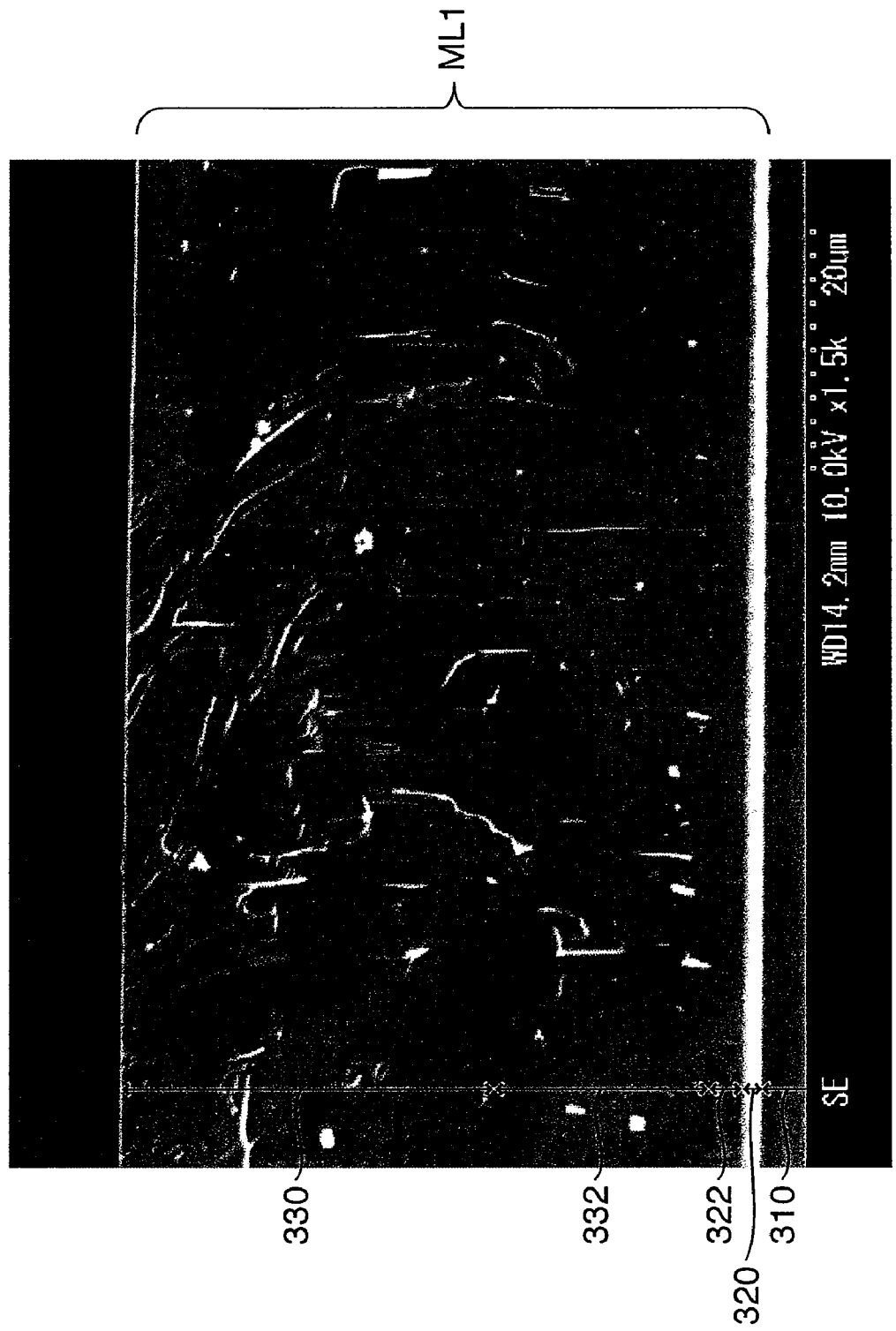
FIG. 12 is a sectional SEM photograph showing a sample obtained by the steps shown in FIGS. 7 to 11.

In the step shown in FIG. 11, the GaN underlying substrate 310 and multilayered film ML1 (in the reaction chamber) are cooled from about 1,000° C. to room temperature. The thermal expansion coefficient of the GaN underlying substrate 310 is almost equal to that of the GaN layer 330. When the temperature is lowered from about 1,000° C. to room temperature, therefore, almost no thermal stress resulting from the thermal expansion coefficient difference acts on the GaN underlying substrate 310 and GaN layer 330, and almost no warping occurs.

For example, the multilayered film ML1 as shown in the sectional SEM photograph of FIG. 12 is obtained by steps similar to those shown in FIGS. 7 to 11. As shown in FIG. 12, the GaN underlying substrate 310 and GaN layer 330 have a flat shape. This makes it possible to estimate that almost no warping has occurred in the GaN underlying substrate 310 and GaN layer 330.

As shown in FIG. 13, a plurality of multilayered films ML1 to ML3 are formed on the GaN underlying substrate 310 by successively repeating the steps shown in FIGS. 7 to 11 without atmospheric exposure. In this way, a structure 300 including the multilayered films ML1 to ML3 is formed on the GaN underlying substrate 310.

The steps shown in FIGS. 7 to 11 can be performed in the same apparatus or in different apparatuses. When these steps are performed in different apparatuses, the individual reaction chambers are connected by a mechanism capable of transferring the substrate without exposing it to the atmosphere.

Figure 15:
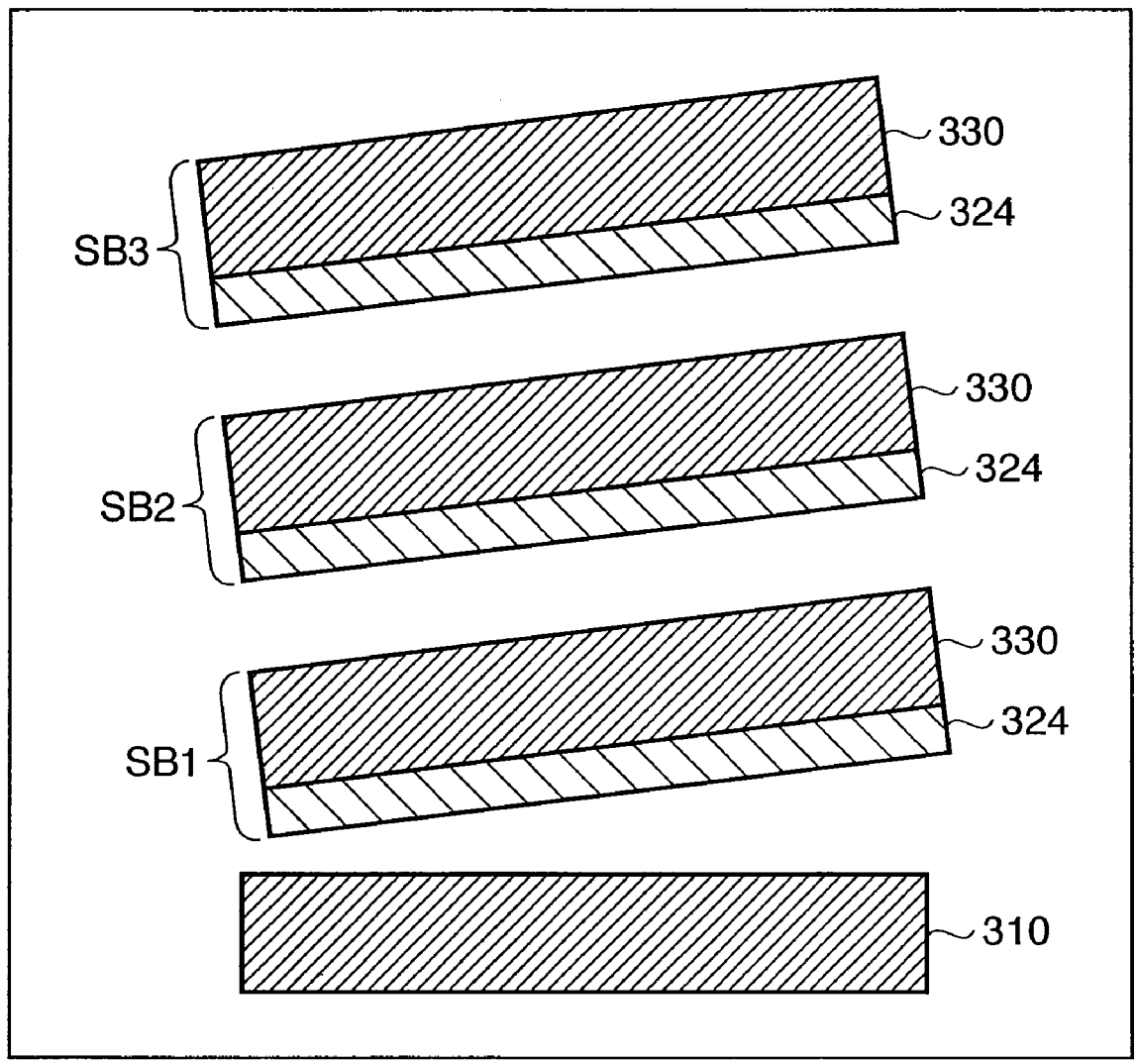
FIG. 15 is a sectional view showing still another step in the semiconductor substrate fabrication method according to the embodiment of the present invention.

In steps shown in FIGS. 14 and 15, the first peeling layers 320 and second peeling layers 322 are simultaneously selectively etched by using a chemical solution. That is, as shown in FIG. 14, the first peeling layers 320 and second peeling layers 322 are etched sideways.

When the first peeling layers 320 are made of, e.g., Cr, the etchant (chemical solution) is preferably an aqueous solution mixture of perchloric acid ($HClO_4$) and ammonium cerium secondary nitrate. When the first peeling layers 320 are made of, e.g., Cu, the etchant (chemical solution) is preferably an aqueous nitric acid ($HNO_3$) solution. The etching rate of the etchant (chemical solution) can be controlled by the temperature and concentration.

When the first peeling layers 320 and second peeling layers 322 are etched, as shown in FIG. 15, a plurality of units of the GaN layers 330 and buffer layers 332 are separated from the GaN underlying substrate 310. That is, a plurality of GaN substrates SB1 to SB3 are simultaneously fabricated by separating the units of the GaN layers 330 and buffer layers 332 from the GaN underlying substrate 310. In this state, the internal stress is almost uniform in each GaN layer 330. This reduces the possibility of cracking of each GaN layer 330.

The buffer layers 332 form portions of the GaN substrates SB1 to SB3 without being etched by the etchant (chemical solution).

Note that in the step shown in FIG. 13, a viscous material may also hold the multilayered films ML1 to ML3 and the GaN underlying substrate 310. In this case, the GaN substrates SB1 to SB3 may also be simultaneously fabricated by dissolving this viscous material after the first peeling layers 320 and second peeling layers 322 are etched. This makes it possible to stably fabricate the GaN substrates SB1 to SB3.

Since the GaN substrates SB1 to SB3 are simultaneously fabricated in the steps shown in FIGS. 14 and 15 as described above, the throughput of the fabrication of the GaN substrates SB1 to SB3 can be increased. Also, since the steps shown in FIGS. 7 to 11 are successively repeated without atmospheric exposure, it is possible to save the time of evacuation and the time of atmospheric exposure (purging), and further increase the throughput of the fabrication of the GaN substrates. Furthermore, since the GaN substrates SB1 to SB3 are simultaneously fabricated, the fabrication conditions of the GaN substrates SB1 to SB3 can be made uniform, so the variations in quality of the GaN substrates SB1 to SB3 can be reduced.

Note that the steps shown in FIGS. 7 to 11 and the steps shown in FIGS. 14 and 15 may also be successively performed without atmospheric exposure. In this case, it is possible to save the time of transfer of samples (lots), and further increase the throughput of the fabrication of GaN substrates.

Note also that the number of the multilayered films included in the structure (the structure 300 shown in FIG. 13) is not limited to three and may also be two or more except three. Increasing the number of the multilayered films included in the structure can further increase the throughput of the fabrication of GaN substrates.

EXPERIMENTAL EXAMPLE

Three GaN substrates SB1 to SB3 were continuously formed by performing the steps shown in FIGS. 7 to 15 (the semiconductor substrate fabrication method according to the embodiment of the present invention) described above. The time required from the supply of the samples to the carrying out of the GaN substrates SB1 to SB3 was 26 hrs.

On the other hand, after the steps shown in FIGS. 7 to 11 were performed, a first peeling layer 320 and second peeling layer 322 as shown in FIG. 11 were etched, and a unit of a GaN layer 330 and buffer layer 332 was separated from a GaN underlying substrate 310 under the same conditions as shown in FIG. 13, thereby separately in turn fabricating GaN substrates SB1 to SB3. The time required from the supply of the samples to the carrying out of the GaN substrates SB1 to SB3 was 52 hrs.

As described above, the throughput when three semiconductor substrates are continuously formed is about twice that when three semiconductor substrates are separately formed.

The invention claimed is:

1. A semiconductor substrate fabrication method comprising:
   a preparation step of preparing an underlying substrate;
   a stacking step of stacking, on the underlying substrate, a plurality of multilayered films, each including a peeling layer, a semiconductor layer, and a buffer layer which is stacked between the peeling layer and the semiconductor layer in each of the plurality of multilayered films; and
   a separation step of separating the semiconductor layer,
   wherein the peeling layer comprises a metal layer and a metal nitride layer, the buffer layer and the semiconductor layer consist of a same material, and
   the plurality of multilayered films are configured such that an upper surface of the semiconductor layer is contacted by the metal layer of the peeling layer and that a lower surface of the semiconductor layer is contacted by the buffer layer, and the metal nitride layer of the peeling layer is located between the buffer layer and the metal layer.

2. The semiconductor substrate fabrication method according to claim 1, wherein
   the buffer layer consists of a single crystal of a compound semiconductor.

3. The semiconductor substrate fabrication method according to claim 1, wherein
   the buffer layer consists of a compound of a group-III element and nitrogen.

4. The semiconductor substrate fabrication method according to claim 1, wherein,
   in the separation step, the semiconductor layer of each of the plurality of multilayered films is separated by selectively etching the peeling layer of each of the plurality of multilayered films by using a chemical solution.

5. The semiconductor substrate fabrication method according to claim 1, wherein,
   in the stacking step, the stacking is successively repeated without atmospheric exposure.

6. The semiconductor substrate fabrication method according to claim 1, wherein, in the stacking step, the peeling layer, the buffer layer, and the semiconductor layer are stacked in a single apparatus.

7. The semiconductor substrate fabrication method according to claim 1, wherein
the underlying substrate and the semiconductor layer both consist of a single crystal of a same compound semiconductor.

8. The semiconductor substrate fabrication method according to claim 1, wherein
the underlying substrate and the semiconductor layer both consist of a same compound of a group-III element and nitrogen.

9. The semiconductor substrate fabrication method according to claim 1, wherein
the underlying substrate and the semiconductor layer consist of a same material.

10. The semiconductor substrate fabrication method according to claim 1, wherein,
in the stacking step, the metal nitride layer is formed by nitriding the metal layer in a reaction furnace in which the semiconductor layer is also grown.

* * * * *